(12) United States Patent
Liu et al.

(10) Patent No.: US 10,971,568 B2
(45) Date of Patent: *Apr. 6, 2021

(54) DISPLAY DEVICE

(71) Applicant: AU OPTRONICS CORPORATION, Hsin-Chu (TW)

(72) Inventors: Chung-Chan Liu, Hsin-Chu (TW); Pin-Miao Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/794,607

(22) Filed: Feb. 19, 2020

(65) Prior Publication Data

US 2020/0185460 A1 Jun. 11, 2020

Related U.S. Application Data

(62) Division of application No. 16/218,558, filed on Dec. 13, 2018, now Pat. No. 10,651,254.

(30) Foreign Application Priority Data

Dec. 22, 2017 (TW) .................................. 106145402

(51) Int. Cl.
*G09G 3/22* (2006.01)
*H01L 27/32* (2006.01)
(Continued)

(52) U.S. Cl.
CPC ............ *H01L 27/326* (2013.01); *G02B 5/003* (2013.01); *G09G 3/22* (2013.01); *G02B 27/281* (2013.01);
(Continued)

(58) Field of Classification Search
CPC .................. G02B 27/281; G02B 5/003; G09G 2300/023; G09G 2300/026;
(Continued)

(56) References Cited

U.S. PATENT DOCUMENTS 7,965,258 B2 * 6/2011 Aoki ..................... G06F 1/1641
345/1.3
10,651,254 B2 * 5/2020 Liu ........................ H01L 27/326
(Continued)

*Primary Examiner* — Tony O Davis
(74) *Attorney, Agent, or Firm* — WPAT, PC

(57) ABSTRACT

The present disclosure provides a display device including a first display panel, a second display panel, at least one detection device, and a control module. The first display panel includes a first display area having first sub-pixel regions, the second display panel includes a second display area having second sub-pixel regions, and the second display panel is movable to at least partially overlap the first display panel. The detection device is disposed on at least one of the first and second display panels to detect a position of the other one and generate a relative position detection signal correspondingly. The control module is electrically connected to the detection device to receive the relative position detection signal and an image display signal from an image signal source, so as to generate a first display signal and a second display signal to respectively output to the first and second display panels.

21 Claims, 11 Drawing Sheets

(51) Int. Cl.
*G02B 5/00* (2006.01)
*G02B 27/28* (2006.01)

(52) U.S. Cl.
CPC ......... *G09G 2300/0439* (2013.01); *G09G 2310/0264* (2013.01); *G09G 2320/0626* (2013.01); *H01L 27/3227* (2013.01); *H01L 27/3237* (2013.01)

(58) Field of Classification Search
CPC ... G09G 2300/0439; G09G 2310/0264; G09G 2320/029; G09G 2320/0626; G09G 3/22; G09G 3/32; H01L 27/3227; H01L 27/3237; H01L 27/326
USPC .......................................... 345/1.3, 156, 690
See application file for complete search history.

(56) References Cited

U.S. PATENT DOCUMENTS

| | | | | |
|---|---|---|---|---|
| 2005/0285811 A1* | 12/2005 | Kawase | ............ | G02F 1/13336 345/1.1 |
| 2006/0125784 A1* | 6/2006 | Jang | ............ | G06F 1/1622 345/156 |
| 2006/0132430 A1* | 6/2006 | Ricks | ............ | G09F 9/35 345/108 |
| 2007/0285341 A1* | 12/2007 | Manning | ............ | G06F 1/1616 345/1.3 |
| 2010/0060547 A1* | 3/2010 | Bloebaum | ............ | G06F 1/1641 345/1.3 |
| 2012/0229374 A1* | 9/2012 | Kobayashi | ............ | G06F 3/1423 345/156 |
| 2012/0309465 A1* | 12/2012 | Tani | ............ | G06F 1/1624 455/566 |
| 2013/0038584 A1* | 2/2013 | Burgin | ............ | G09F 9/30 345/205 |
| 2013/0321339 A1* | 12/2013 | Irie | ............ | H04M 1/0247 345/174 |
| 2013/0328934 A1* | 12/2013 | Lim | ............ | G06F 1/1677 345/650 |
| 2014/0055922 A1* | 2/2014 | Mori | ............ | H05K 5/0217 361/679.01 |
| 2015/0070276 A1* | 3/2015 | Pance | ............ | G09G 3/003 345/156 |
| 2015/0138214 A1* | 5/2015 | Roh | ............ | G06F 1/1647 345/520 |
| 2015/0262331 A1* | 9/2015 | Bang | ............ | G06F 3/1446 345/1.3 |
| 2015/0316976 A1* | 11/2015 | Toyotaka | ............ | G06F 1/1641 361/679.27 |
| 2017/0374749 A1* | 12/2017 | Lee | ............ | H05K 5/0086 |
| 2019/0198575 A1* | 6/2019 | Liu | ............ | H01L 27/326 |
| 2019/0261519 A1* | 8/2019 | Park | ............ | G06F 1/1677 |
| 2019/0320048 A1* | 10/2019 | Yang | ............ | G06F 1/1658 |
| 2020/0185460 A1* | 6/2020 | Liu | ............ | G09G 3/22 |

* cited by examiner

DISPLAY DEVICE

FIELD OF DISCLOSURE

The present disclosure relates to a display device. Specifically, the present disclosure relates to an assembled display device having movable panels.

RELATED ART

Nowadays, a display device is one of the most used and popular devices. However, there may still be a plurality of disadvantages or incapability in various applications for display devices, for example, how to enlarge the size of the display device.

SUMMARY

An embodiment of the present disclosure provides a display device, including a first display panel, a second display panel, at least one detection device, and a control module. The first display panel includes a first display area having a plurality of first sub-pixel regions, the second display panel includes a second display area having a plurality of second sub-pixel regions, and the second display panel is movable to at least partially overlap the first display panel. The detection device is disposed on at least one of the first display panel and the second display panel to detect a position of the other one and generate a relative position detection signal correspondingly. The control module is electrically connected to the detection device to receive the relative position detection signal and an image display signal from an image signal source, so as to generate a first display signal and a second display signal to respectively output to the first display panel and the second display panel.

According to the display device provided in the embodiment of the present disclosure, at least two display panels can be assembled and coordinated to collectively and continuously display an image. Therefore, an assembled display device having a relatively superior display quality can be achieved.

DETAILED DESCRIPTION

Hereinafter, various embodiments will be described, and one of ordinary skill in the art of the present disclosure shall readily understand the spirit and principles of the present disclosure by referring to the description in conjunction with the figures. However, although the description specifically describes some specific embodiments, the embodiments are merely exemplary, and shall not be considered to be limitative or exhaustive in all aspects. Therefore, for one of ordinary skill in the art, various variants and modifications of the present disclosure made without departing from the spirit and principle of the present disclosure would be apparent and can be achieved easily.

In the accompanying drawings, for clarity, the thickness of layers, membranes, panels, areas, or the like is exaggerated. In the whole specification, the same referential numeral indicates the same element. It should be understood that when an element such as a layer, a membrane, an area, or a substrate is referred as "on" another element or "connected to" another element, the element may be directly on another element or directly connected to another element, or there may be an intermediate element. On the contrary, when an element is referred as "directly on another element" or "directly connected to" another element, there is not an intermediate element. As used herein, the "connection" may refer to physical and/or electric connection (coupling). Therefore, for "electric connection" or "coupling", there may be another element between the two elements.

The terms "about", "approximately", or "substantially" used herein include the value and an average of values within an acceptable tolerance range of a specific value determined by one of ordinary skill in the art, in consideration of a specific quantity of measurement and measurement related errors discussed (that is, limitation of a measuring system). For example, "about" may indicate within one or more standard deviation of the value, or within ±30%, ±20%, ±10%, or ±5% of the value. Further, for the terms "about", "approximately", or "substantially" used herein, a relatively acceptable tolerance range or standard deviation may be selected based on optical properties, etching properties, or other properties, rather than one standard is applied to all properties.

Unless otherwise defined, all the terms used in herein (including technical and scientific terms) have the same meanings as generally understood by one of ordinary skill in the art. It should be further understood that terms such as those defined in generically used dictionaries should, unless explicitly defined herein, be interpreted to have meanings the same as the terms in the related art and the context of the present disclosure, and should not be interpreted to have ideal or excessively formal meanings.

In the following text, a display device 10 according to an embodiment of the present disclosure will be described with reference to FIG. 1.

Figure 1:
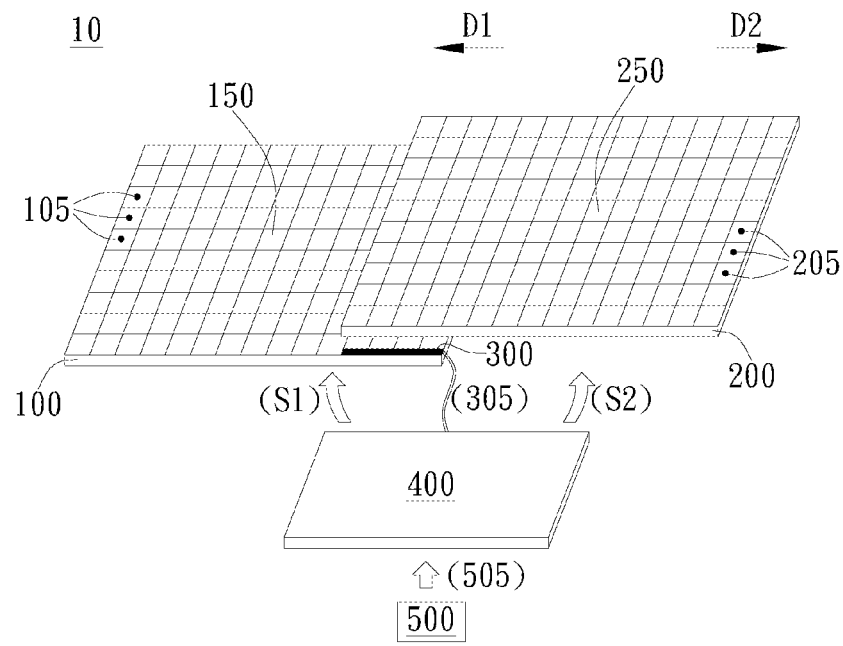
FIG. 1 is a schematic diagram of a display device according to an embodiment of the present disclosure.

Referring to FIG. 1, the display device 10 according to an embodiment of the present disclosure includes a first display panel 100, a second display panel 200, at least one detection device 300, and a control module 400.

Specifically, the first display panel 100 includes a first display area 150 having a plurality of first sub-pixel regions 105, and the second display panel 200 includes a second display area 250 having a plurality of second sub-pixel regions 205.

Herein, the first sub-pixel region 105 and the second sub-pixel region 205 may be defined as minimal units for displaying and light emitting (or referred to as light-emitting regions), and the first display area 150 and the second display area 250 may be defined as areas for implementing a display function of the first display panel 100 and second display panel 200 respectively. In addition, although not presented herein, at least one of the first display panel 100 and the second display panel 200 may additionally include a non-display area without a display function.

According to this embodiment of the present disclosure, the second display panel 200 is movable to at least partially overlap the first display panel 100 from the top, but is not limited it. For example, the second display panel 200 may move in a direction of D1 or D2 to overlap at least part of the first display panel 100.

The at least one detection device 300 included in the display device 10 may be disposed on at least one of the first display panel 100 and the second display panel 200 to detect a position of the other one. For example, referring to FIG. 1, the detection device 300 may be disposed on the first display panel 100 to detect a position of the second display panel 200. However, the present disclosure is not limited herein, and the detection device 300 may also be disposed on the second display panel 200 to detect a position of the first display panel 100. In other embodiments, the detection device 300 may also be disposed on both the first display panel 100 and the second display panel 200 to respectively detect positions of the second display panel 200 and the first display panel 100.

The detection device 300 may be disposed at any position of the first display panel 100 and/or the second display panel 200, and may detect the position of the other display panel in any manner. Therefore, the detection device 300 of the present disclosure is not limited to the position and possible mechanism specifically described in the specification.

Thereafter, after detecting the position of the other display panel, the detection device 300 generates a relative position detection signal 305 correspondingly and transmits the relative position detection signal 305 to the control module 400.

For example, the control module 400 is electrically connected to the detection device 300 to receive the relative position detection signal 305. Herein, the electric connection may be implemented in various manners such as various wires or other circuits or conduction layers. Thereafter, as long as the relative position detection signal 305 can be transmitted to the control module 400, the aspect of electrically connecting the control module 400 to the detection device 300 may include various changes and is not limited to the specific wire form drawn herein.

Apart from receiving the relative position detection signal 305 from the detection device 300, the control module 400 may also receive an image display signal 505 from one or more image signal sources 500. Specifically, the relative position detection signal 305 indicates a relative position between the first display panel 100 and the second display panel 200, and the image display signal 505 indicates at least one of various display contents such as a pattern, text, or image expected to be displayed by the display device 10 assembled (or namely joined, or namely tiled) from the first display panel 100 and the second display panel 200.

Next, based on the received relative position detection signal 305 and the image display signal 505, the control module 400 may generate a first display signal S1 and a second display signal S2 and respectively output the first display signal S1 and the second display signal S2 to the first display panel 100 and the second display panel 200. Therefore, the control module 400 may coordinate and integrate display image presented by the first display panel 100 and the second display panel 200 by the first display signal S1 and the second display signal S2. In addition, in some embodiments, in addition to the first display signal S1 and the second display signal S2, the control module 400 may further generate a extending display signal (not marked) based on the relative position detection signal 305 and the image display signal 505, such that the first display signal S1, the second display signal S2 and the extending display signal (not marked) respectively control display images presented by the first display panel 100 and the second display panel 200. For example, the first display signal S1, the second display signal S2, and the extending display signal (not marked) generated accordingly from the detection position and the adjusted position at which an image is expected to display may respectively control the first area, the second overlap area, and the second area to collectively and continuously display an extended image (the detail described in the below).

In this way, according to this embodiment of the present disclosure, an expected image may be coordinated and integrated based on the first display signal S1 and the second display signal S2, or the first display signal S1, the second display signal S2, and the extending display signal (not marked) when the second display panel 200 at least partially overlaps the first display panel 100 from the top, so as to achieve a display effect in a relatively large size with a relatively superior display quality.

Next, referring to the embodiment of the present disclosure shown in FIG. 2, the aspect of displaying an expected image by the first display panel 100 and the second display panel 200 will be described.

It should be noted that in the specification, for the sake of convenience, an example in which the upper second display panel 200 overlaps the lower first display panel 100 is used. However, the present disclosure is not limited herein. That is, there may also be an aspect in which the upper first display panel 100 overlaps the lower second display panel 200, and the specific principles described herein are also applied for the function mechanism correspondingly.

Figure 2:
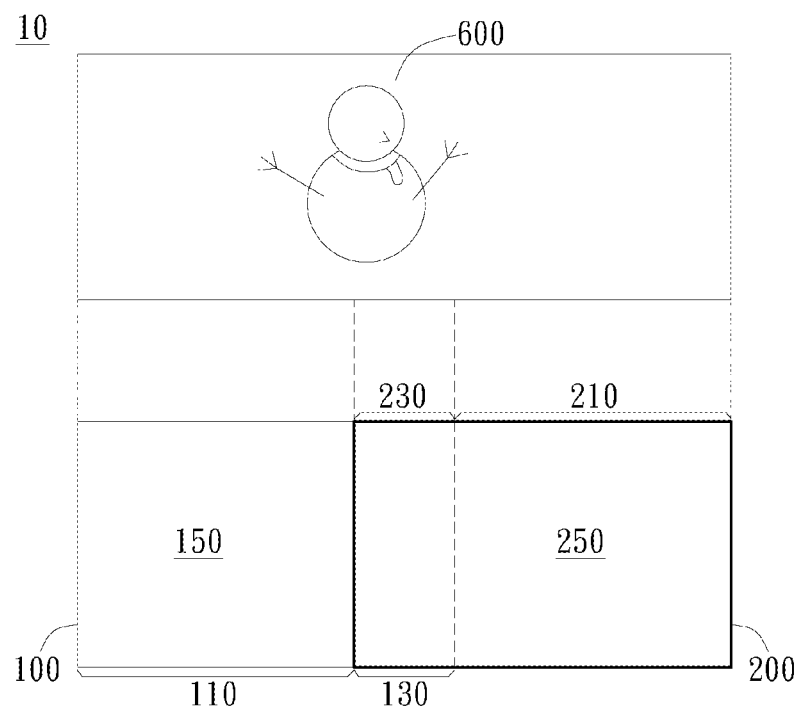
FIG. 2 is a schematic diagram of an aspect of displaying expected images on a first display panel and a second display panel according to an embodiment of the present disclosure.

Referring to FIG. 2, a top view of the display device 10 in FIG. 1, when the second display panel 200 at least partially overlaps the first display panel 100 from the top, the first display area 150 includes a first area 110 not overlapping the second display panel 200 and a first overlap area 130 connected to the first area 110 and overlapping the second display panel 200. Similarly, the second display area 250 includes a second overlap area 230 overlapping the first overlap area 130 and may further include a second area 210 connected to the second overlap area 230. Thereafter, the first area 110 and the second overlap area 230 may be respectively controlled by using the first display signal S1 and the second display signal S2 to collectively and continuously display an extended image (or namely a continued image, or namely a tiled image, or namely an image). That is, display content 600 is displayed and extended in the first area 110 and the second overlap area 230. In addition, for the foregoing example, in some embodiments, apart from the first display signal S1 and the second display signal S2, the control module 400 may further generate a extending display signal (not marked) based on the relative position detection signal 305 and the image display signal 505, so that the first display signal S1, the second display signal S2, and the extending display signal (not marked) generated accordingly from the detection position and the adjusted position at which an image is expected to display respectively control the first area 110, the second overlap area 230, and the second area 210 to collectively and continuously display an extended image (or namely a continued image, or namely a tiled image, or namely an image). However, the foregoing description is merely exemplary, the present disclosure is not limited herein, and coordination can be performed based on one or more other display signals or modes, such that an expected portion or area displays an expected part of image.

Next, various modified embodiments of a method for implementing the extended display content 600 as shown in FIG. 2 will be exemplarily described with reference to FIG. 3A and FIG. 3B.

Figure 3A:
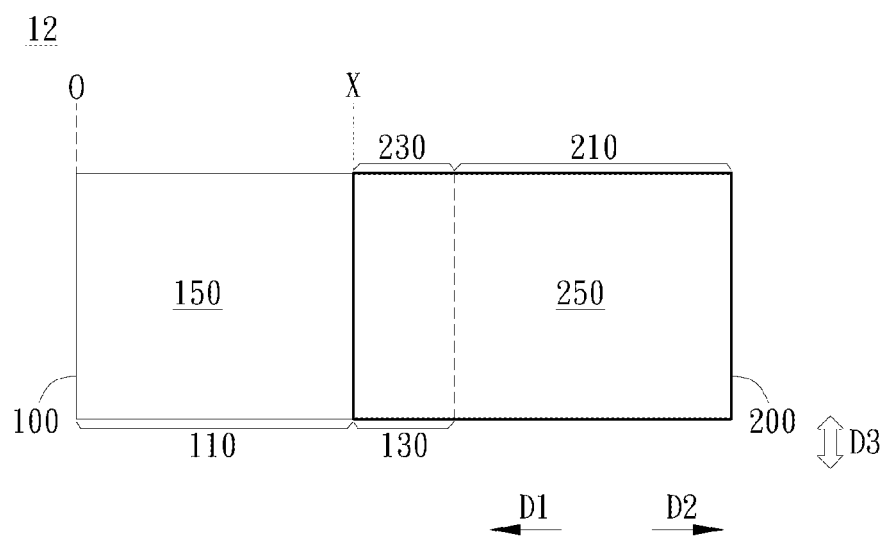
FIG. 3A and FIG. 3B are schematic diagrams of a display device and a method for implementing extended display according to different embodiments of the present disclosure.

First, referring to FIG. 3A, according to an embodiment of the present disclosure, the second display panel 200 of a display device 12 does not have a transparent area through which display light of the first display panel 100 can pass. For example, the second overlap area 230 of the second display panel 200 does not have a transparent area through which display light of the first overlap area 130 can pass.

In this case, according to a first modified embodiment of the present disclosure, the first overlap area 130 and the second overlap area 230 may substantially display the same image. For example, the first display area 150 may display an integrated and continuous image, the second display area 250 may display another integrated and continuous image, and the first overlap area 130 and the second overlap area 230 may substantially display the same and totally overlapping image. Thereafter, the display light of the first overlap area 130 cannot pass through the second overlap area 230, and therefore only the image in the second overlap area 230 can be substantially perceived when a user is watching the display device 10. In this way, the entire display device 12 can display an integrated and extended display content.

Next, also referring to FIG. 3A, according to a second modified embodiment of the present disclosure, the first overlap area 130 may not display an image, and the second overlap area 230 may display an image extended from the first area 110 of the first display area 150. Specifically, only the second overlap area 230 of the overlapping portion of the first overlap area 130 and the second overlap area 230 performs display.

For example, if the first area 110 displays to an $X^{th}$ line of sub-pixels (for example, an $X^{th}$ line of first sub-pixel regions 105) of the display content, then a first line of second sub-pixel regions 205 of the second display area 250 may continuously and sequentially display the display content from an $(X+1)^{th}$ line of sub-pixels of the display content. Thereafter, the entire display device 12 can display the integrated and extended display content.

Herein, the directionality of the $X^{th}$ line is defined based on an overlapping direction of the first display panel 100 and the second display panel 200. For example, when the first display panel 100 and the second display panel 200 substantially overlap in the horizontal direction (for example, directions D1 and D2 in FIG. 3A) or when the first display panel 100 and the second display panel 200 overlap in the left and right direction, the $X^{th}$ line of sub-pixels may be an $X^{th}$ column of sub-pixels (for example, as shown in FIG. 3A). In contrast, when the first display panel 100 and the second display panel 200 substantially overlap in the vertical direction (for example, a direction D3 in FIG. 3A) or when the first display panel 100 and the second display panel 200 overlap in the up and down direction, the $X^{th}$ line of sub-pixels may be an $X^{th}$ row of sub-pixels (not shown). However, the present disclosure is not limited to the specific described overlapping direction, the first display panel 100 and the second display panel 200 may overlap in other appropriate directions, and the $X^{th}$ line is defined correspondingly according to the foregoing principles.

Next, other modified embodiments of the present disclosure will be described with reference to FIG. 3B.

Figure 3B:
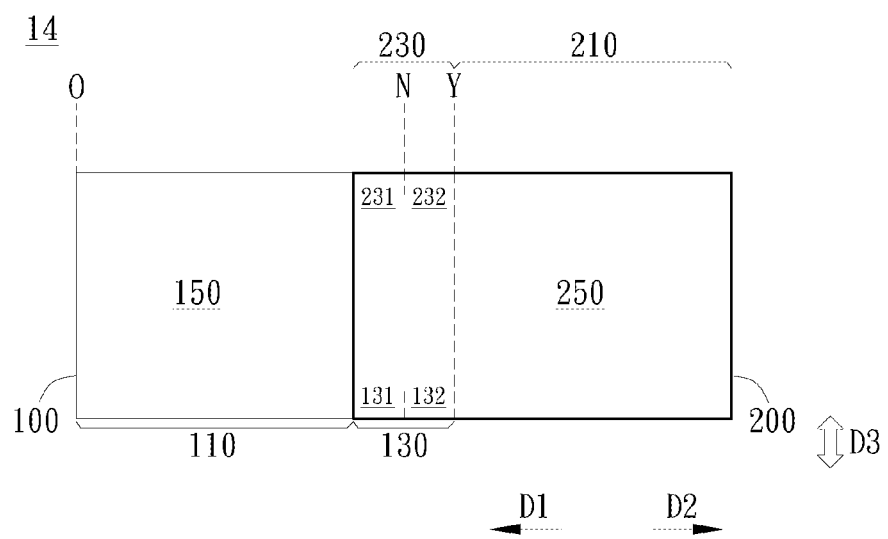

Referring to FIG. 3B, according to an embodiment of the present disclosure, the second display panel 200 of a display device 14 has a transparent area through which display light of the first display panel 100 can pass. For example, the second overlap area 230 of the second display panel 200 has a transparent area through which display light of the first overlap area 130 can pass. Specifically, at least some of the second sub-pixel regions 205 of the second overlap area 230 may allow light to pass through. Therefore, the display light of the first overlap area 130 may pass through the second overlap area 230 to be watched (seen).

Thereafter, according to a third modified embodiment of the present disclosure, the first overlap area 130 and the second overlap area 230 may substantially display the same image. Specifically, the first display area 150 may display an integrated and continuous image, the second display area 250 may display another integrated and continuous image, and the first overlap area 130 and the second overlap area 230 may substantially display the same and totally overlapping images. Specifically, the first display signal may be enabled to control the first overlap area 130 to display an image substantially the same as that of the second overlap area 230 and display the image through the second sub-pixel regions 205 of the second overlap area 230.

In this case, the first overlap area 130 and the second overlap area 230 may display at reduced brightness by regulating the first display signal and the second display signal, so as to avoid excessive brightness. In this way, the entire display image may still be presented at relatively even and expected brightness, rather than being excessively bright due to the first overlap area 130 and the second overlap area 230 substantially display the same image.

In some embodiments, the respective brightness of the first overlap area 130 and the second overlap area 230 may be determined based on a transparency of the second overlap area 230. For example, when the expected brightness for presenting is approximately 100% and it is assumed that the second overlap area 230 is totally transparent (that is, the transparence is approximately 100%), the first overlap area 130 displays at the brightness of approximately 50% and the second overlap area 230 displays at the brightness of approximately 50%, so as to substantially display the same content as expected. However, the foregoing description is merely exemplary, and as long as the expected brightness for presenting can be displayed, a ratio of the brightness of the first overlap area 130 to the brightness of the second overlap area 230 may be adjusted accordingly based on the transparency (transparence) of the second overlap area 230. For example, it might be a manner in which the second overlap area 230 supplement the insufficient light according to a transmittance of light emitted by the first overlap area 130. In this way, the entire display device 14 can display the integrated and extended display content.

In view of a trade-off between the capability of human eyes for identification and signal processing costs, generally, a gray level value can used for displaying is about 64 (for example, a gray level value of an 8-bit display signal). Therefore, according to some embodiments of the present disclosure, the first display signal controls the first overlap area 130 to display at a gray level value no greater than about 64, thereby avoiding excessive brightness of overlapped display of the first overlap area 130 and the second overlap area 230. For example, when the second overlap area 230 covering the first overlap area 130 is mainly used to emit light, the first overlap area 130 may not emit light and therefore be in a totally dark state. In contrast, when the first overlap area 130 covered by the second overlap area 230 is mainly used to emit light, in order to enable a gray level value expected to be provided by light emitted by the first overlap area 130 after passing through the second overlap area 230 to be not greater than about 64, the gray level value of light emitted by the first overlap area 130 can be controlled to be not greater than about 64. In such case, the regulation can be performed by controlling a sum of gray level values of light emitted by the first overlap area 130 and the second overlap area 230 is substantially equal to or less than about 64. However, the foregoing description is merely exemplary, and the present disclosure is not limited herein.

Next, also referring to FIG. 3B, according to a fourth modified embodiment of the present disclosure, the first display area 150 may display to an $N^{th}$ line of sub-pixels at any position of an overlapping portion of the first overlap area 130 and the second overlap area 230, and the second display area 250 may correspondingly display content from an $(N+1)^{th}$ line of sub-pixels. Therefore, without duplication of display, the entire display device 14 can display the integrated and extended display content.

For example, according to the fourth modified embodiment, the first overlap area 130 has a first portion 131 connected to the first area 110 and a second portion 132 connected to the first portion 131, and the second overlap area 230 has a third portion 231 and a fourth portion 232 respectively corresponding to the first portion 131 and the second portion 132. The first display signal and the second display signal respectively control the first area 110, the first portion 131, and the fourth portion 232 to collectively and continuously display an extended image (or namely a continued image, or an image) or a substantial extended image (or namely a substantial continued image, or an substantial image). For example, the first display signal and the second display signal may be controlled to respectively enable the first portion 131 and the fourth portion 232 to display and enable the second portion 132 and the third portion 231 not to display, and this display manner is used to display integrated and extended image to improve the continuity of images at the overlapping portion, or the first display signal and the second display signal may be controlled to respectively enable the second portion 132 and the third portion 231 to display and enable the first portion 131 and the fourth portion 232 not to display, and this display manner is used to display integrated and extended image to improve the continuity of images at the overlapping portion. However, the present disclosure is not limited herein, and other display modes may also be used to enable the first area 110, the first portion 131, and the fourth portion 232 to display integrated and extended image or substantial integrated and extended image.

Further, according to a fifth modified embodiment of the present disclosure, display of the overlapping portion of the first overlap area 130 and the second overlap area 230 may be performed totally by the first overlap area 130. That is, referring to FIG. 3B, the first display area 150 may display to a $Y^{th}$ line of sub-pixels at an edge of the first display area 150. Thereafter, the second overlap area 230 may have a transparent area to enable display content of the first overlap area 130 to pass through, and the second display area 250 directly display on the second area 210 from the display content of a $(Y+1)^{th}$ line of sub-pixels, while the second overlap area 230 does not display.

That is, according to the fifth modified embodiment, the first display signal and the second display signal respectively control the first area 110, the first overlap area 130, and the second area 210 to collectively and continuously display an extended image (or namely a continued image, or an image). Therefore, without duplication of display, the entire display device 14 can display the integrated and extended display content. In addition, for example, in different aspects similar to the foregoing embodiments, according to this embodiment of the present disclosure, other extending display signals may further be included to control different sections of the same display panel, which is not described in detail herein.

Herein, according to some preferable embodiments of the present disclosure, in order to conveniently coordinate the display content with continuity, the respective amounts of the first sub-pixel regions 105 and the second sub-pixel regions 205 in the adjacent and overlapping first display area 150 and second display area 250 along the direction D3 are substantially the same or present an integer multiple relationship. Alternatively, in a moving or overlapping direction D1 or D2 and/or in a direction D3 along the overlapped edge, the amounts of sub-pixel regions used for displaying the same line of sub-pixels of the display content in the first display panel 100 and the second display panel 200 are substantially the same or of an integer multiple relationship. However, the present disclosure is not limited herein.

In the following text, a method for a display device to detect a relative position between a first display panel 100 and a second display panel 200 by at least one detection device 300 will be described.

Figure 4A:
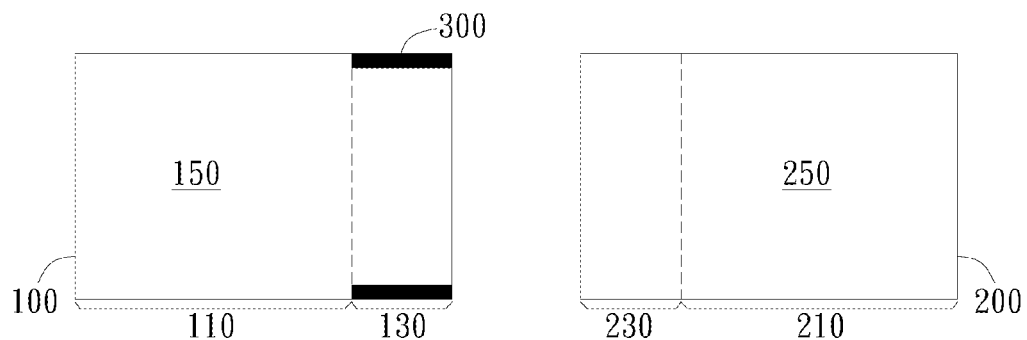
FIG. 4A and FIG. 4B are schematic diagrams of a display device and a method for detecting a relative position of a first display panel and a second display panel by at least one detection device according to different embodiments of the present disclosure.

First, referring to a display device 16 in FIG. 4A, according to a sixth modified embodiment of the present disclosure, at least one detection device 300 may be disposed in a first overlap area 130 and detect the brightness of an image generated by a second overlap area 230. For example, when it is preset that the upper second display panel 200 overlaps the lower first display panel 100, the at least one detection device 300 may be disposed in the first overlap area 130 of the first display area 150 and may detect the brightness of sub-pixels generated by the second overlap area 230.

In this case, the second display panel 200 may have a property of dual emission and the at least one detection device 300 may be an optical sensor. For example, dual emission may be achieved by disposing sub-pixels on both surfaces (for example, inner and outer surfaces, or referred to as front and back surfaces) of the second display panel 200, or by disposing a structure such as a circuit and sub-pixels in a pattern or manner to enable light emitted from sub-pixels disposed on a second display area 250 (for example, an inner surface, or referred to as a front surface, for example, the upper surface of the second display panel 200) to pass through a back surface (or referred to as an outer surface) of the second display panel 200. In this way, light emitted from the back surface of the second display panel 200 can be detected by the at least one detection device 300, such that a relative distance between the first display panel 100 and the second display panel 200 can be deduced.

For example, the at least one detection device 300 may detect a position of the second display panel 200 based on a difference in gray levels of different portions of display content expected to be displayed on the second display panel 200. For example, if the gray level of the second display panel 200 varies from a first line of sub-pixel regions to a last line of sub-pixel regions (for example, gradually increasing or gradually decreasing, and/or with feature points), the at least one detection device 300 may detect the position of the second display panel 200 based on the measured value of the pixel gray level, but the present disclosure is not limited hereto. For example, the present disclosure is not limited to the detection of a change in the gray level from the first line of sub-pixel regions to the last line of sub-pixel regions (for example, a progressive change of gradually increasing or gradually decreasing, and/or a manner of using a feature easy to identify), the position of the second display panel 200 may also be detected by detecting a change in the gray level and/or a feature from a specific line of sub-pixel regions to the last line of sub-pixel regions, or any part of the sub-pixel regions.

Figure 4B:
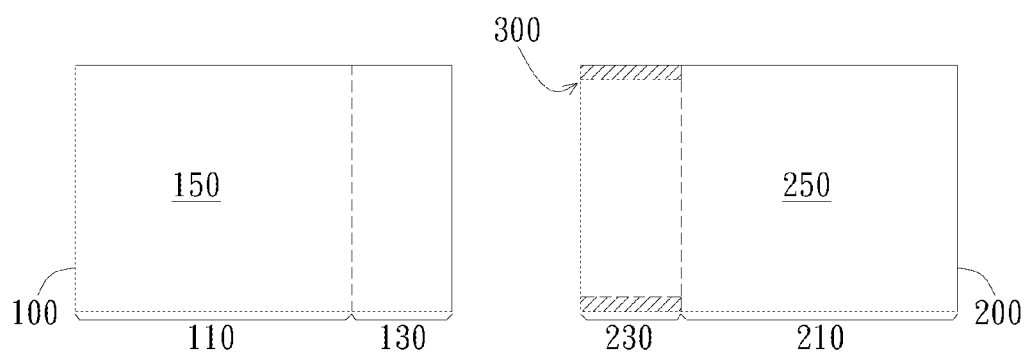

Next, referring to FIG. 4B, according to a seventh modified embodiment of the present disclosure, if it is also preset that the upper second display panel 200 overlaps the lower first display panel 100 from the top, the at least one detection device 300 may also be disposed in the second overlap area 230 opposite to the second display area 250 and may detect the brightness of sub-pixels generated by the first overlap area 130.

In this case, the first display panel 100 and the second display panel 200 both do not need to have a dual emission feature and the at least one detection device 300 may be an optical sensor. In this way, light emitted towards the back of the second display panel 200 can be detected by the at least one detection device 300, such that a relative distance between the first display panel 100 and the second display panel 200 can be detected.

Herein, mechanisms and structures of the seventh modified embodiment that are substantially the same as or similar to those of the sixth modified embodiment will be not described repetitively in detail.

Thereafter, according to the sixth modified embodiment and the seventh modified embodiment, the at least one detection device 300 may be disposed in at least some of first sub-pixel regions or second sub-pixel regions, and respectively detect the brightness of the opposite second sub-pixel regions or first sub-pixel regions facing the first sub-pixel regions or the second sub-pixel regions, so as to generate a relative position detection signal.

Figure 5:
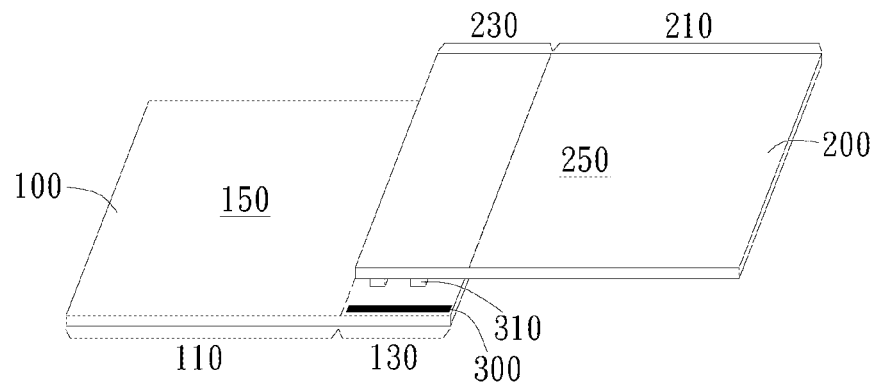
FIG. 5 and FIG. 6 are schematic diagrams of a display device and a method for detecting a relative position of a first display panel and a second display panel by at least one detection device according to different embodiments of the present disclosure.

The foregoing manner for detecting the brightness of a sub-pixel region is merely exemplary, and the present disclosure is not limited herein. For example, referring to FIG. 4A in conjunction with FIG. 5, according to an eighth modified embodiment of the present disclosure, when the at least one detection device 300 is disposed in the first overlap area 130, a surface of the second overlap area 230 opposite thereto may include at least one signal source 310. In this way, the at least one detection device 300 may detect a signal emitted by the signal source 310 to generate the relative position detection signal.

The foregoing aspect with reference to the eighth modified embodiment may also be applied to FIG. 4B. For example, similar to FIG. 5 and the relative configuration of the detection device 300 and the signal source 310 is opposite to that in FIG. 5, when the at least one detection device 300 is disposed in the second overlap area 230, a surface of the first overlap area 130 opposite thereto may include at least one signal source 310.

Thereafter, when the at least one detection device 300 is disposed in either one of at least some of the first sub-pixel regions and at least some of the second sub-pixel regions (for example, in sub-pixel regions of either one of the first display area 150 and the second display area 250), the at least one signal source 310 is disposed in the other one of the at least some of the first sub-pixel regions and the at least some of the second sub-pixel regions (for example, in sub-pixel regions of the other one of the first display area 150 and the second display area 250).

Herein, the at least one signal source 310 may be a device that emits invisible light, electromagnetic wave, or emitted signals in any other forms, and the present disclosure is not limited herein.

Further, according to a ninth modified embodiment of the present disclosure, if micro light-emitting elements such as micro light-emitting diodes (micro LEDs) are disposed in the first sub-pixel region and second sub-pixel region, the at least one detection device 300 and the at least one signal source 310 may also be respectively disposed on the micro light-emitting elements on the first display panel 100 and the second display panel 200. The size of the micro light-emitting element is less than 100 micrometers (μm), preferably, less than 60 μm, but the present disclosure is not limited herein. In some embodiments, the micro light-emitting element may be a micro inorganic light-emitting element, a micro organic light-emitting element, a micro inorganic-organic hybrid light-emitting element, or another suitable micro light-emitting element.

Figure 6:
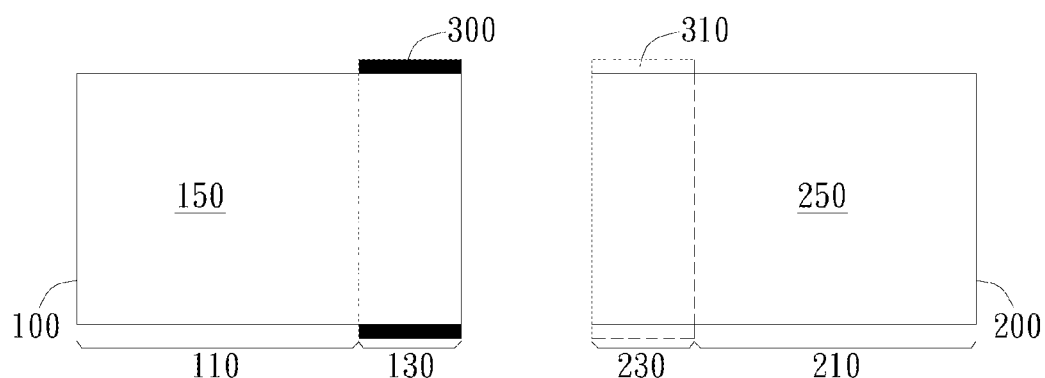

Next, referring to FIG. 6, in a display device 22 according to a tenth modified embodiment of the present disclosure, the at least one detection device 300 and the at least one signal source 310 may also be respectively disposed in non-display areas on the first display panel 100 and the second display panel 200. For example, the at least one detection device 300 and the at least one signal source 310 do not necessarily need to be disposed in the first display area 150 and/or the second display area 250, but may be disposed, for example, as shown in FIG. 6, in areas on the first display panel 100 and the second display panel 200 apart from the first display area 150 and the second display area 250. In this case, similar to the foregoing other embodiments, the at least one signal source 310 and the at least one detection device 300 are correspondingly disposed opposite to each other, the at least one detection device 300 is disposed outside of either one of the first display area 150 and the second display area 250, and the at least one signal source 310 is disposed outside of the other one of the first display area 150 and the second display area 250. From another perspective, in some embodiments, the at least one detection device 300 and the at least one signal source 310 both may be disposed outside of the first display area 150 and the second display area 250, but the detection device 300 and the signal source 310 located in different display areas may correspond to each other.

Besides, in the foregoing embodiments, although it is shown that the at least one signal source 310 and the at least one detection device 300 are both disposed in the display area, or are both disposed in the non-display area, the present disclosure is not limited herein. For example, on the premise that a signal emitted by the signal source 310 can be detected by the detection device 300, either one of the at least one signal source 310 and the at least one detection device 300 may be disposed in the display area, and the other one thereof may be disposed in the non-display area. Moreover, the signal source 310 and the detection device 300 may also be disposed on the connection ends of the movable first display panel 100 and the second display panel 200 connected to another device, and the present disclosure is not limited herein.

For example, when the at least one detection device 300 is disposed on either one of the first display panel 100 and the second display panel 200, the at least one signal source 310 may be disposed on the other one of the first display panel 100 and the second display panel 200, such that a relative position between the first display panel 100 and the second display panel 200 can be detected. In addition, the present disclosure is not limited to the foregoing form as long as the relative position between the first display panel 100 and the second display panel 200 can be detected. The signal source 310 and the detection device 300 may be controlled by using a thin-film transistor, an IC, or other suitable control elements of the first display panel 100 and the second display panel 200.

Herein, the amount, size, shape, form, structure, and functional mechanism of the signal sources 310 and the detection devices 300 drawn in the embodiments with reference to FIG. 4A to FIG. 6 are merely exemplary. Therefore, on the premise of fulfilling the purpose of the present disclosure, the signal sources 310 and the detection devices 300 may substantially be of any amount, size, shape, form, structure, and functional mechanism, and the present disclosure is not limited herein.

Next, a method for implementing a transparent area of the second overlap area 230 will be described with reference to FIG. 7A to FIG. 10B. According to some embodiments of the present disclosure, when the second overlap area 230 overlaps the first overlap area 130 from the top, light emitted by the first overlap area 130 may pass through the second overlap area 230 so as to be perceived (for example, as described with reference to FIG. 3B). For example, the second overlap area 230 may have a transparent area (for example, a second transparent area 204), such that light emitted by the first overlap area 130 can pass through the second overlap area 230, and examples of the aspect thereof will be described in detail in the following text. However, the manner for enabling the light emitted by the first overlap area 130 to pass through the second overlap area 230 according to the embodiments of the present disclosure is not limited herein.

Figure 7A:
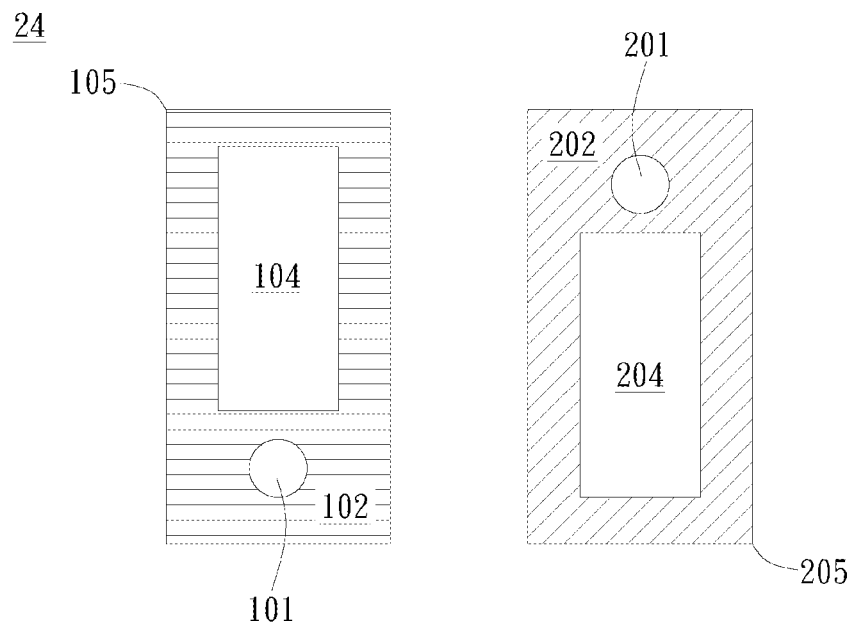
FIG. 7A to FIG. 11 are schematic diagrams of a display device and a method for implementing a transparent area of a second overlap area according to different embodiments of the present disclosure.

Thereafter, with reference to FIG. 7A showing an enlarged schematic diagram of one of the first sub-pixel regions 105 and one of the second sub-pixel regions 205, according to an eleventh modified embodiment of the present disclosure, at least some first sub-pixel regions 105 located in the first overlap area 130 have at least one first light-emitting area 102, and at least some second sub-pixel regions 205 located in the second overlap area 230 have at least one second light-emitting area 202. In addition, the at least one first light-emitting area 102 corresponds to at least one first transparent area 104, and the at least one second light-emitting area 202 corresponds to at least one second transparent area 204. For example, the at least one first light-emitting area 102 and the at least one first transparent area 104 may be located in a same first sub-pixel region 105, and the at least one second light-emitting area 202 and the at least one second transparent area 204 may be located in a same second sub-pixel region 205.

Herein, the first light-emitting area 102 and the second light-emitting area 202 may be areas for displaying and emitting light in the first sub-pixel region 105 and the second sub-pixel region 205. For example, the first light-emitting area 102 and the second light-emitting area 202 may respectively include micro light-emitting elements 101 and 201, for example, micro LEDs, or other suitable micro light-emitting elements. In addition, the first transparent area 104 and the second transparent area 204 may be transparent areas provided with openings for light to transmit, without elements of a metal circuit (for example, an electrode or a circuit), or without shield or reflecting elements (for example, a black matrix (BM)) at the display panel. However, the foregoing is merely exemplary, and the manners for the first light-emitting area 102 and the second light-emitting area 202 to display and emit light and for the first transparent area 104 and the second transparent area 204 to present transparent are not limited to the aspects described herein.

Figure 7B:
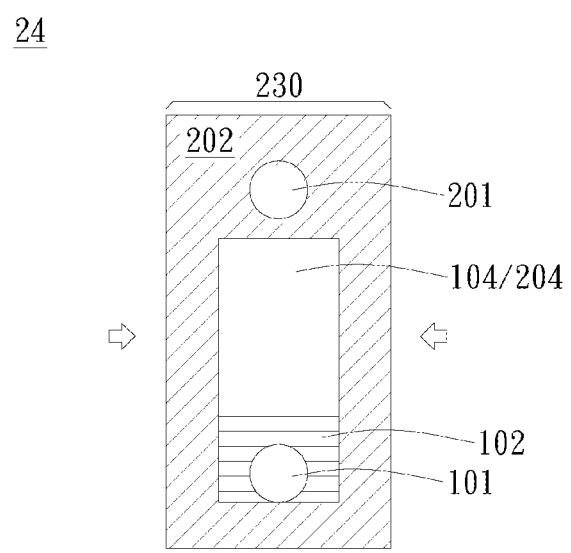

Referring to FIG. 7B, when the second overlap area 230 of the second display panel 200 overlaps the first overlap area 130 of the first display panel 100 from the top in the display device 24 according to the modified embodiment of the present disclosure such that the second sub-pixel region 205 overlaps the first sub-pixel region 105 from the top as shown in FIG. 7A, the at least one second transparent area 204 at least partially overlaps the at least one first light-emitting area 102 from the top, the at least one second transparent area 204 at least partially overlaps the at least one first transparent area 104 from the top, and projection ranges of the first light-emitting areas 102 in the second overlap area 230 are staggered with the second light-emitting areas 202. Further, as the design shown above, the first transparent area 104 may at least be partially covered or shielded by the second light-emitting area 202, for example, the configuration as shown in FIG. 7B.

In this way, light emitted from the first light-emitting area 102, for example, from the micro light-emitting element 101, may pass through the second transparent area 204 to emit out, so as to achieve an effect that the second overlap area 230 substantially has a transparent area. In addition, since the first sub-pixel region 105 and the second sub-pixel region 205 may be manufactured through the same manufacturing process to reduce a required manufacturing process, the first sub-pixel region 105 may also have the first transparent area 104. In this case, whether the first display panel 100 overlaps the second display panel 200 from the top, the second display panel 200 overlaps the first display panel 100 from the top, or the transmittance of the entire overlap area is increased relative to the background based on the demands and expectation can be alternatively selected. However, if the design only allows the second display panel 200 to overlap the first display panel 100 from the top and the manufacturing process condition is available, the first sub-pixel region 105 may also be set not to have the first transparent area 104.

Next, referring to FIG. 8A to FIG. 9B, a twelfth modified embodiment and a thirteenth modified embodiment of different implementation aspects of the transparent area configuration will be further described in the following text.

Figure 8A:
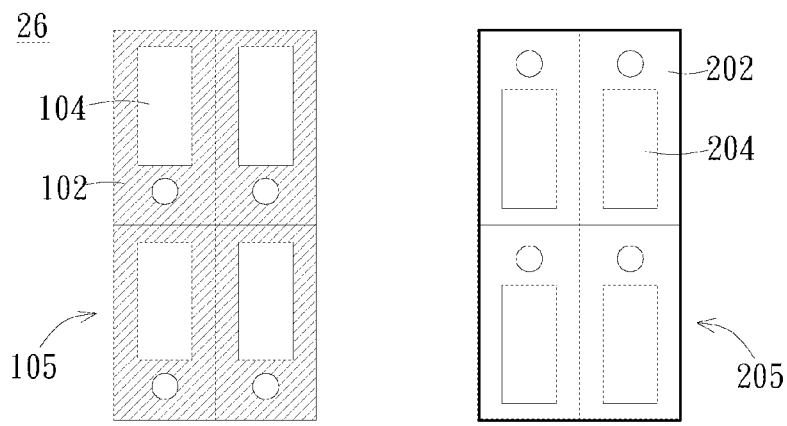
Figure 8B:
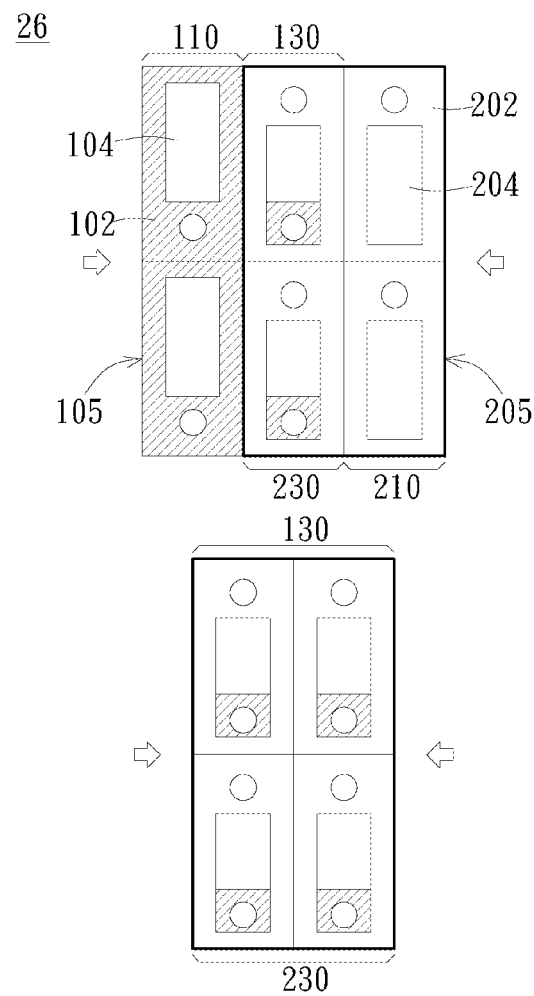

Referring to FIG. 8A, a display device 26 according to the twelfth modified embodiment of the present disclosure, in the at least some first sub-pixel regions 105, the first transparent areas 104 may all be disposed at one end of the first light-emitting area 102 (for example, the upper end), and in the at least some second sub-pixel regions 205, the second transparent areas 204 may all be disposed at the other end of the second light-emitting area 202 (for example, the lower end). Therefore, referring to FIG. 8B, when the second display panel 200 overlaps the first display panel 100 from the top, different amounts of lines of sub-pixel regions may overlap freely (for example, one line, two lines, or the like of the sub-pixel regions overlapped with each other) to implement the function of a transparent area of the second overlap area. Therefore, the first display panel 100 and the second display panel 200 may have a relatively high degree of freedom while overlapping.

Figure 9A:
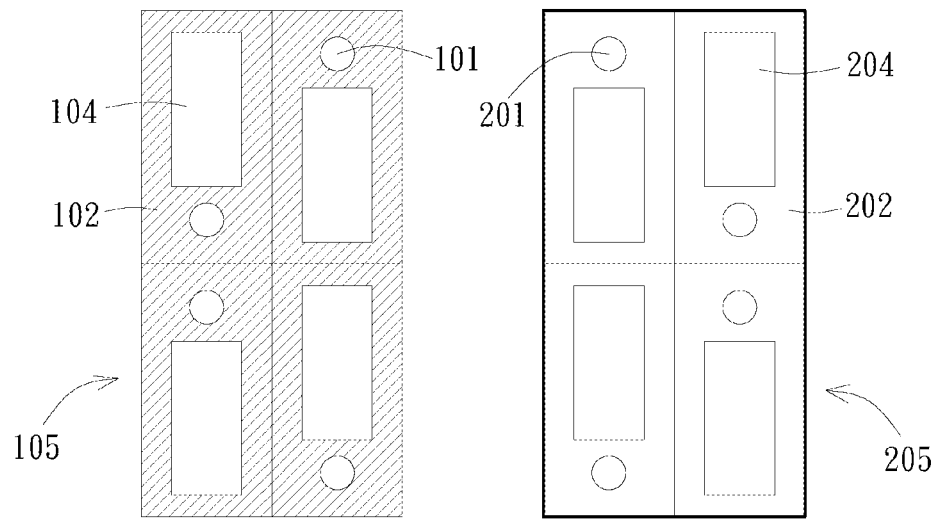

In contrast, referring to FIG. 9A, in a display device 28 according to the thirteenth modified embodiment of the present disclosure, in the at least some first sub-pixel regions 105, the first transparent areas 104 may be disposed at two ends (for example, the upper and lower ends) of the first light-emitting area 102 alternately in a zigzag (or namely jagged) arrangement manner, and the micro light-emitting elements 101 in the first light-emitting area 102 may also be disposed at two ends (for example, the upper and lower ends) of the first transparent area 104 alternately in a zigzag (or namely jagged) arrangement manner. For example, the micro light-emitting element 101 in the first light-emitting area 102 in the first sub-pixel region 105 at the upper-left corner in FIG. 9A is located at one end (for example, the lower end) of the first transparent area 104; the micro light-emitting element 101 in the first light-emitting area 102 in the first sub-pixel region 105 at the lower-left corner in FIG. 9A is located at the other end (for example, the upper end) of the first transparent area 104; the micro light-emitting element 101 in the first light-emitting area 102 in the first sub-pixel region 105 at the upper-right corner in FIG. 9A is located at the other end (for example, the upper end) of the first transparent area 104; and the micro light-emitting element 101 in the first light-emitting area 102 in the first sub-pixel region 105 at the lower-right corner in FIG. 9A is located at one end (for example, the lower end) of the first transparent area 104.

Similarity, in the at least some second sub-pixel regions 205, the second transparent areas 204 may also be disposed at two ends (for example, the upper and lower ends) of the second light-emitting area 202 alternately in a zigzag (or namely jagged) arrangement manner, and the micro light-emitting elements 201 in the second light-emitting area 202 may also be disposed at two ends (for example, the upper and lower ends) of the second transparent area 204 alternately in a zigzag (or namely jagged) arrangement manner. For example, the micro light-emitting element 201 in the second light-emitting area 202 in the second sub-pixel region 205 at the upper-left corner in FIG. 9A is located at one end (for example, the upper end) of the second transparent area 204; the micro light-emitting element 201 in the second light-emitting area 202 at the lower-left corner in FIG. 9A is located at the other end (for example, the lower end) of the second transparent area 204; the micro light-emitting element 201 in the second light-emitting area 202 at the upper-right corner in FIG. 9A is located at the other end (for example, the lower end) of the second transparent area 204; and the micro light-emitting element 201 in the second light-emitting area 202 at the lower-right corner in FIG. 9A is located at one end (for example, the upper end) of the second transparent area 204. Therefore, referring to FIG. 9B, when the second display panel 200 overlaps the first display panel 100 from the top, a specific amount of lines of sub-pixel regions (for example, two lines of sub-pixel regions) is needed to overlap correspondingly, so as to implement the function of a transparent area (for example, the second transparent area 204) of the second overlap area 230. In this way, whether the first display panel 100 and the second display panel 200 are adjusted to an expected degree of overlapping is confirmed based on whether the function of a transparent area (for example, the second transparent area 204) of the second overlap area 230 is implemented.

Further, the overlapping sequence of the first display panel 100 and the second display panel 200 is not limited to the description in this embodiment, the upper first display panel 100 may overlap the lower second display panel 200 from the top, and other description may be changed with reference to the foregoing relevant description, and a person having ordinary skill in the art should readily understand such embodiments based on the above description.

Next, for a display device 30 according to a fourteenth modified embodiment of the present disclosure, another aspect for implementing the function of a transparent area of the second overlap area will be described with reference to FIG. 10A and FIG. 10B.

Figure 9B:
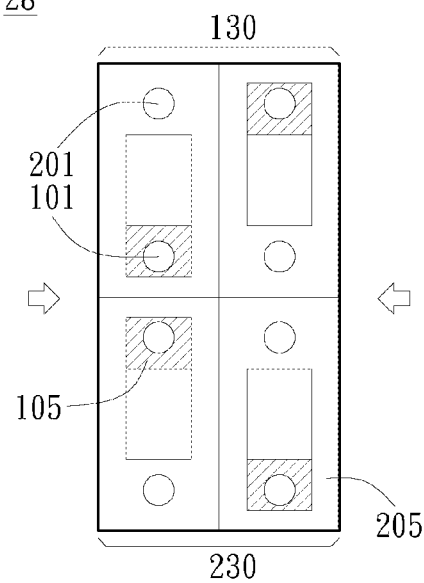
Figure 10A:
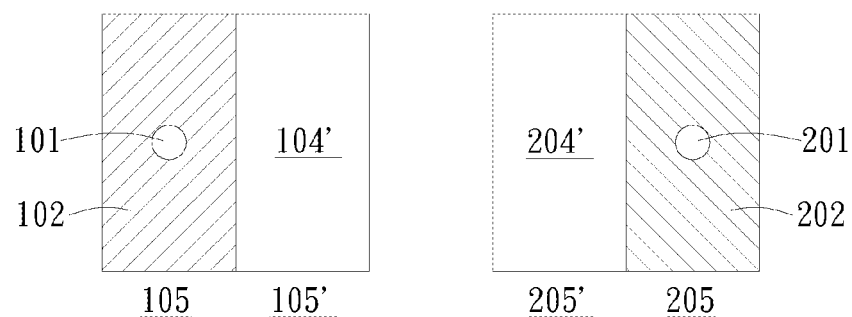

Referring to FIG. 10A, a difference between the fourteenth modified embodiment of the present disclosure and the foregoing embodiments illustrated with reference to FIG. 7A to FIG. 9B lies in that a first transparent area 104' or a second transparent area 204' are not respectively disposed with the first light-emitting area 102 or the second light-emitting area 202 in the same first sub-pixel region 105 or the same second sub-pixel region 205 together. As described above, in some embodiments, the first transparent area 104' and the first light-emitting area 102 may be disposed in the same first sub-pixel region 105, and/or the second transparent area 204' and the second light-emitting area 202 may be disposed in the same second sub-pixel region 205. However, in some embodiments, the first transparent area 104' and the first light-emitting area 102 may be disposed in different first sub-pixel regions 105, and/or the second transparent area 204' and the second light-emitting area 202 may be disposed in different second sub-pixel regions 205.

For example, in the display device 30, the at least one first transparent area 104' serves as a virtual first sub-pixel region (or namely a dummy first sub-pixel region) 105', and the at least one second transparent area 204' serves as a virtual second sub-pixel region (or namely a dummy second sub-pixel region) 205'. Further, the virtual first sub-pixel region 105' corresponds to the first sub-pixel region 105, and the virtual second sub-pixel region 205' corresponds to the second sub-pixel region 205, such that the at least one first light-emitting area 102 corresponds to the at least one first transparent area 104', and the at least one second light-emitting area 202 corresponds to the at least one second transparent area 204'.

Figure 10B:
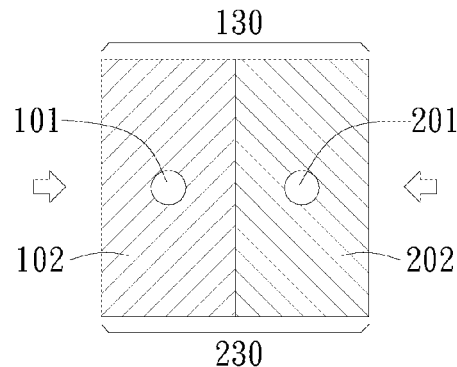

In this case, referring to FIG. 10B, when the second display panel overlaps the first display panel from the top, the second transparent area 204' at least partially overlaps and corresponds to the first light-emitting area 102, the second light-emitting area 202 at least partially overlaps and corresponds to the first transparent area 104', and projection ranges of the first light-emitting areas 102 in the second overlap area 230 are staggered with the second light-emitting areas 202. Therefore, light emitted from the first light-emitting area 102 (for example, light emitted by the micro light-emitting element 101) may pass through the second transparent area 204' to emit out, so as to achieve an effect that the second overlap area 230 substantially has a transparent area. Further, as the design shown above, the first transparent area 104' may be at least partially covered or shielded by the second light-emitting area 202, for example, the configuration as shown in FIG. 10A and FIG. 10B.

In addition, since the combination of the first sub-pixel region 105 and the virtual first sub-pixel region 105' and the combination of the second sub-pixel region 205 and the virtual second sub-pixel region 205' may be manufactured through the same manufacturing process to reduce a required manufacturing process, the first display panel may be provided with the virtual first sub-pixel region 105' of the first transparent area 104'. In this case, whether the first display panel 100 overlaps the second display panel 200 from the top, the second display panel 200 overlaps the first display panel 100 from the top, or the transmittance of the entire overlap area is increased relative to the background based on the demands and expectation can be alternatively selected. However, if the design only allows the second display panel 200 to overlap the first display panel 100 from the top and the manufacturing process condition is available, then the first transparent area 104' might not be provided.

Similarity, similar to the above modified embodiments as shown with reference to FIG. 9A and FIG. 9B, according to the modified embodiments as shown in FIG. 10A and FIG. 10B, sub-pixel regions need to be correspondingly overlapped at specific positions to implement the function of a transparent area (for example, the second transparent area 204') of the second overlap area 230. Therefore, whether an expected degree of overlapping between the first display panel 100 and the second display panel 200 is achieved may be confirmed based on the function of the transparent area (for example, the second transparent area 204') of the second overlap area 230.

Further, for a display device 32 according to a modified embodiment of the present disclosure, another aspect for implementing the function of the transparent area of the second overlap area 230 will be described with reference to FIG. 11.

Figure 11:
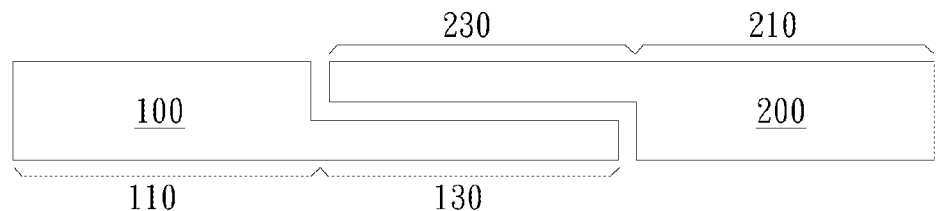

Referring to FIG. 11, according to the fifteenth modified embodiment of the present disclosure, overall thickness of each of the first display panel 100 and the second display panel 200 may be fixed, while the thickness of each of the first overlap area 130 and the second overlap area 230 may be less than the thickness of each of the first area 110 and the second area 210. In this way, elements and structures through which the light needs to pass are reduced, the transmittance of the second overlap area 230 may be increased, such that display light of the first overlap area 130 can transmit through a preset transparent area of the second overlap area 230.

In addition, there may also be a form in which only the thickness of the first overlap area 130 is less than the thickness of the first area 110, or the thickness of the second overlap area 230 is less than the thickness of the second area 210 for achieving the setting of the needed transparent area. Generally, when it is expected that the upper second display panel 200 overlaps the lower first display panel 100 from the top, in order to enable light of the first display panel 100 to pass through, the thickness of the second overlap area 230 of the second display panel 200 is set to be less than the thickness of the second area 210. On the contrary, when it is expected that the upper first display panel 100 overlaps the lower second display panel 200 from the top, in order to enable light of the second display panel 200 to pass through, the thickness of the first overlap area 130 of the first display panel 100 is set to be less than the thickness of the first area 110.

Further, the aspect of reducing the thickness of the first overlap area 130 and the second overlap area 230 may also be applied in the foregoing other embodiments so long as there are no conflicts, and the present disclosure is not limited herein.

The thickness of the relatively thin first overlap area 130 and the relatively thin second overlap area 230 may be achieved through various manufacturing processes, for example, cutting or etching, and the first overlap area 130 and the second overlap area 230 may also be provided with corresponding positioning structures or fixing parts to help positioning. However, the foregoing description is merely exemplary, and the present disclosure is not limited herein.

According to the foregoing embodiments, an assembled (or namely tiled) display device having two or more movable panels may be applied to various environments in accordance with the foregoing principles, to implement a large-scale integrated and extended display image, thereby improving the experience of an observer.

The following text further describes various modified embodiments of the display device of the present disclosure applied to the environments.

Thereafter, when the display device is applied to an indoor environment or an environment having little interference backlight, or an appearance of the display device is expected to have a good transmittance, implementation is achieved by disposing transparent areas both in the first overlap area and the second overlap area as stated above. However, when the assembled display device of the present disclosure is applied to an outdoor environment or an environment having much interference backlight, since the display quality degrades due to that the light of the display content is apt to be interfered by backlight passing through from the back, the interference of ambient backlight needs to be reduced.

Next, a display device having a design of reducing interference from ambient backlight will be described with reference to FIG. 12 to FIG. 15.

Figure 12:
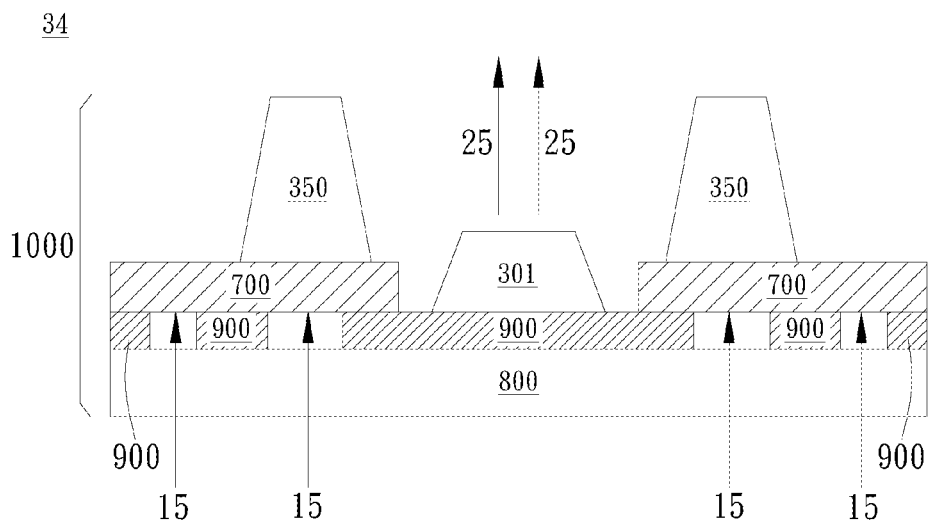
FIG. 12 to FIG. 17 are schematic diagrams of a display device and a method for blocking interference of backlight on display according to different embodiments of the present disclosure.

First, according to a sixteenth modified embodiment of the present disclosure, FIG. 12 is a schematic cross sectional diagram of adding a light shielding layer 700 into a display panel 1000 of a display device 34. Herein, the display panel 1000 may be either one of the first display panel 100 or the second display panel 200 of the foregoing embodiments, and the present disclosure is not limited herein.

Specifically, to prevent backlight 15 (for example, sunlight or lamp light) from passing through the display panel 1000 and emitting out to interfere display light 25 emitted by the display panel 1000, the light shielding layer 700 may be added into the display panel 1000. In detail, the display panel 1000 may include a substrate 800 through which light can pass through, an element layer 900 (for example, a thin-film transistor, an electrode, a circuit, or a protection layer) distributed on the substrate 800, a micro light-emitting element 301 configured to emit display light 25 for displaying, a shield member 350 (disposed selectively) disposed on adjacent micro light-emitting elements 301 or the minimal light-emitting units to isolate and prevent the emitted display light 25 from mixing or interfering each other, and a light shielding layer 700 disposed on the element layer 900 excluding the light-emitting area (for example, the micro light-emitting element 301).

The display panel 1000 further includes the light shielding layer 700, and the light shielding layer 700 may be generally disposed on the entire display panel 1000 (for example, disposed in the first area and the first overlap area, or disposed in the second area and the second overlap area). Assuming that the display panel 1000 is the first display panel 100 as stated in other embodiments and the upper second display panel 200 overlaps the lower first display panel 100 from the top, and the second display panel 200 has a second transparent area (for example, at least one of the second sub-pixel regions in the second overlap area, referring to FIG. 7A to FIG. 10B) that allows the display light 25 emitted by the first display panel 100 to pass through, then the at least one second transparent area may at least partially overlap the light shielding layer 700 in the first overlap area.

In this way, the display light 25 emitted by the first display panel 100 may still emit out through the second display panel 200, and the backlight 15 that is from the background and may cause interference cannot emit out through the second display panel 200 or even through the first display panel 100, thereby improving the display quality of the entire display device 34.

Herein, the light shielding layer 700 may be made of any material having a light shielding effect, for example, a BM, metal and/or alloy, a light-absorbing material or a dark organic material, and the substrate 800 through which light can pass through may be glass or other flexible substrate. However, the foregoing description is merely exemplary, and the present disclosure is not limited herein.

Figure 13:
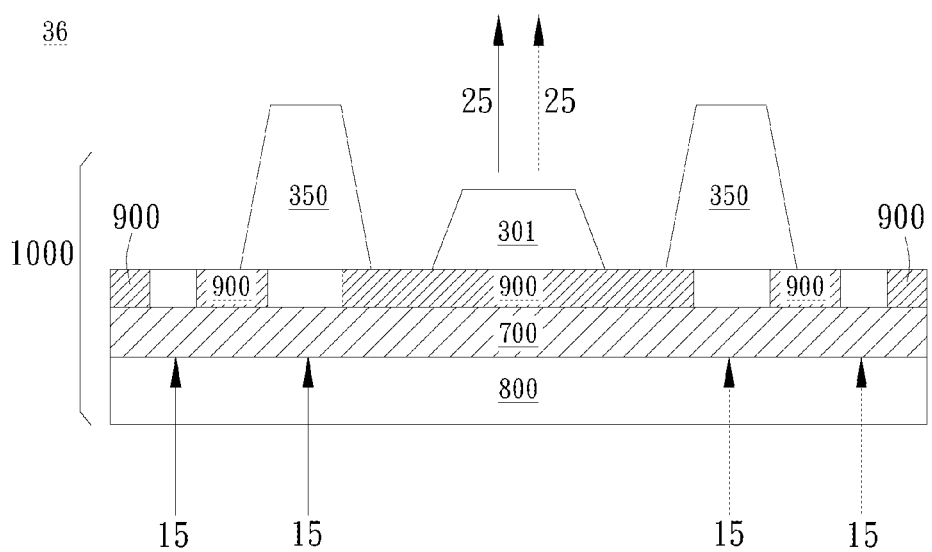

Next, referring to FIG. 13, in the display substrate 1000 of a display device 36 according to a seventeenth modified embodiment of the present disclosure, the stated light shielding layer 700 may also be entirely disposed between the element layer 900 and the substrate 800, and the step of excluding the light emitting area (for example, the micro light-emitting element 301) can be omitted. In this way, the interference from the backlight 15 can also be blocked without impeding emission of the display light 25. If the light shielding layer 700 is made of a conductive material, an insulation layer may be further provided between the light shielding layer 700 and the element layer 900, so as to avoid the influence that may be caused by a short circuit therebetween.

In this modified embodiment, description that is substantially the same as or similar to that in FIG. 12 as stated above (for example, the overlapping state between the first display panel 100 and the second display panel 200, and the material of the light shielding layer) will not be described herein repetitively.

Figure 14:
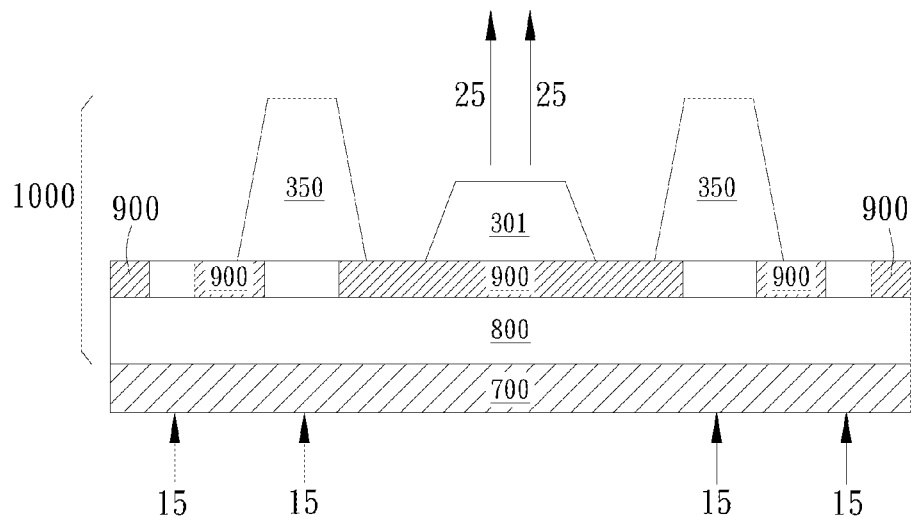

Further, referring to FIG. 14, in the display substrate 1000 of a display device 38 according to an eighteenth modified embodiment of the present disclosure, the light shielding layer 700 may also be entirely disposed on the back (for example, an outer surface) of the substrate 800 opposite to the element layer 900, and the step of excluding the light emitting area (for example, the micro light-emitting element 301) can be omitted. In this way, the interference from the backlight 15 can also be blocked without impeding emission of the display light 25.

In this modified embodiment, description substantially the same as or similar to that in FIG. 12 (for example, the overlapping state between the first display panel 100 and the second display panel 200, and the material of the light shielding layer) will be not described herein repetitively.

Figure 15:
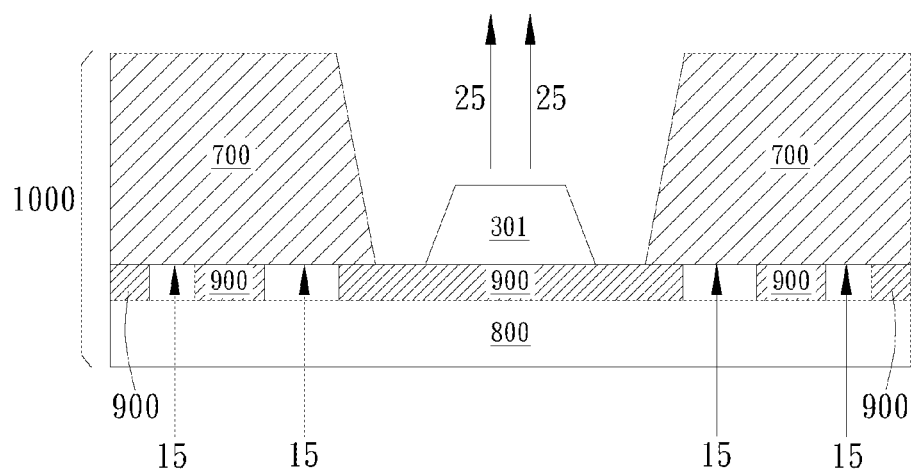

Further, referring to FIG. 15, in the display substrate 1000 of a display device 40 according to a nineteenth modified embodiment of the present disclosure, the stated light shielding layer 700 may also integrate the function of the original shield member 350 and be disposed on the whole element layer 900 or part of the element layer 900 excluding the light-emitting area. In this way, the interference from the backlight 15 can also be blocked without impeding emission of the display light 25.

In this modified embodiment, description substantially the same as or similar to that in FIG. 12 (for example, the overlapping state between the first display panel 100 and the second display panel 200, and the material of the light shielding layer) will be not described herein repetitively.

In the foregoing modified embodiment, the manner of distribution and gap arrangement of the element layer 900 is merely exemplary, and the distribution and gap arrangement of the element layer 900 in the display panel 1000 is substantially configured based on design of the thin-film transistor, the electrode, the circuit, the protection layer, or the like, and the present disclosure is not limited herein.

Figure 16:
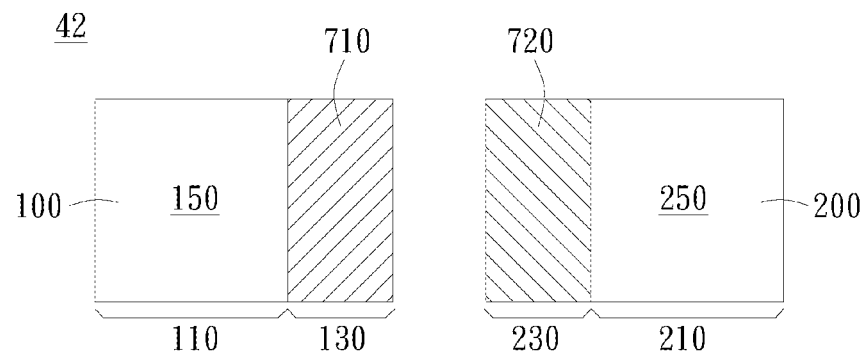
Figure 17:
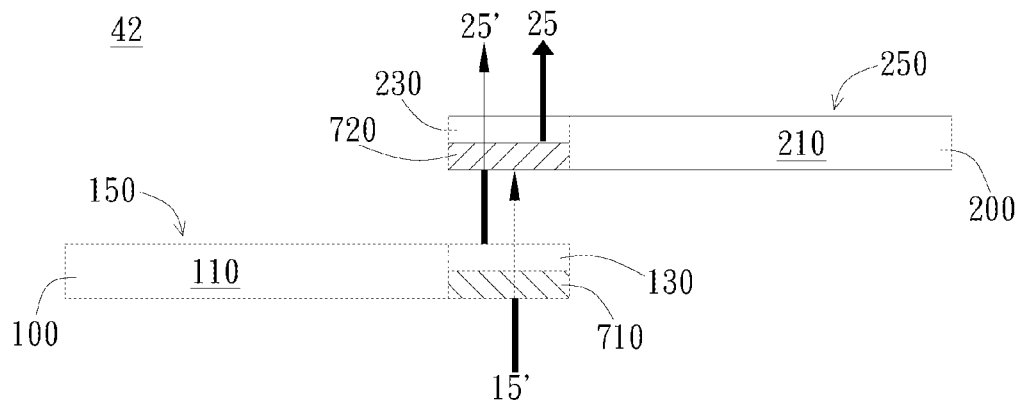

In addition, apart from the foregoing examples, the aspect in which the display light of the first display panel 100 is allowed to pass through while interference of the backlight is avoided when the upper second display panel 200 overlaps the lower first display panel 100 from the top may also be implemented as in a twentieth modified embodiment shown in FIG. 16 and FIG. 17.

Specifically, in a display device 42 in FIG. 16 and FIG. 17 according to the twentieth modified embodiment of the present disclosure, the first display panel 100 further includes a first polarizing layer 710 in the first overlap area 130, the second display panel 200 further includes a second polarizing layer 720 in the second overlap area 230, and a polarization direction of the first polarizing layer 710 is orthogonal to that of the second polarizing layer 720 (for example, at approximately 90 degrees, but the present disclosure is not limited herein). The first polarizing layer 710 and the second polarizing layer 720 may be respectively disposed on outer surfaces of the substrates of the first display panel 100 and the second display panel 200. In some embodiments, the first polarizing layer 710 and the second polarizing layer 720 may be respectively disposed on inner surfaces of the substrates of the first display panel 100 and the second display panel 200. In the other embodiments, the first polarizing layer 710 may be disposed on an inner surface of the substrate of the first display panel 100, and the second polarizing layer 720 may be disposed on an outer surface of the substrate of the second display panel 200, or the first polarizing layer 710 may be disposed on an outer surface of the substrate of the first display panel 100 and the second polarizing layer 720 may be disposed on an inner surface of the substrate of the second display panel 200.

In this way, referring to FIG. 17, although part of backlight 15' can be incident into the second display panel 200 through the first polarizing layer 710 of the first display panel 100, the part of the backlight 15' passing through the first display panel 100 is totally blocked by the second polarizing layer 720 because the polarization direction of the second polarizing layer 720 is exactly orthogonal to that of the first polarizing layer 710 (for example, at approximately 90 degrees, but the present disclosure is not limited herein). In contrast, display light 25' emitted from the first display panel 100 is directly incident into the second display panel 200 without passing through the first polarizing layer 710, and therefore at least part of the display light 25' emits out through the second polarizing layer 720. Thereafter, interference on display by the backlight 15' can be avoided while keeping the light emitted by the first display area 150 to pass through the second display panel 200.

Herein, on the premise of not shielding the display light emitted by the display panel, the polarizing layer may be disposed at any position in the display panel. Thereafter, FIG. 16 and FIG. 17 are merely exemplary, and the present disclosure is not limited herein.

Next, an aspect actually using an embodiment of the display device of the present disclosure will be described with reference to FIG. 18.

Figure 18:
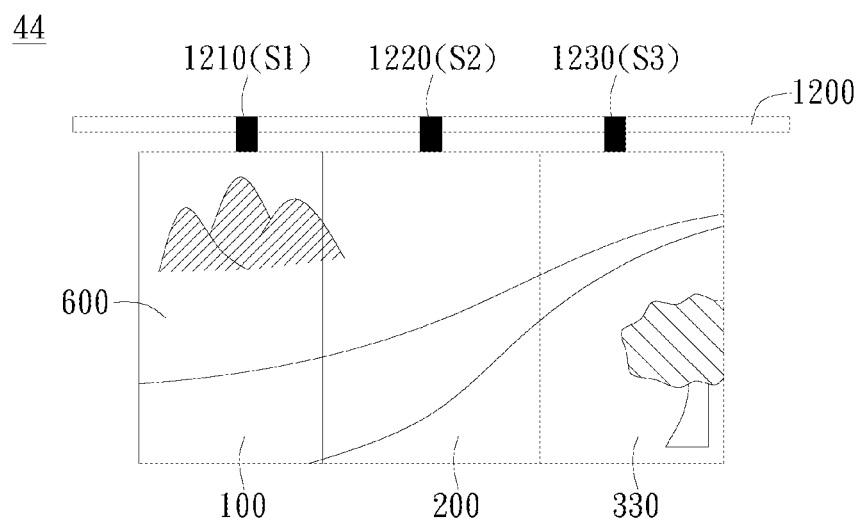
FIG. 18 is a schematic diagram of implementing an assembled display device by assembling a plurality of movable display panels according to different embodiments of the present disclosure.

Referring to FIG. 18, in a display device 44 according to a twenty first modified embodiment of the present disclosure, two or more display panels, for example, a first display panel 100, a second display panel 200, and a third display panel 330, may be movable, and may be assembled to form the display device 44 having a relatively large display size.

Specifically, the display device 44 may include a connecting frame 1200 of, for example, a sliding rail or a winding shaft. The first display panel 100 has a first end 1210 movably connected to the connecting frame 1200, the second display panel 200 has a second end 1220 movably connected to the connecting frame 1200, and the third display panel 330 has a third end 1230 movably connected to the connecting frame 1200. In this way, the first display panel 100, the second display panel 200, and the third display panel 330 may separately move along the connecting frame 1200 and overlap each other. In this configuration, the first display panel 100 may receive a first display signal S1 from the first end 1210 via a first drive circuit (not shown), the second display panel 200 may receive a second display signal S2 from the second end 1220 via a second drive circuit (not shown), and the third display panel 330 may receive a third display signal S3 from the third end 1230 via a third drive circuit (not shown). In addition, for example, in some embodiments, if different blocks of the same display panel are controlled by different display signals, the first display panel 100 may receive different display signals for correspondingly controlling different blocks of the first display panel 100 from the first end 1210 via the first drive circuit (not shown), the second display panel 200 may receive different display signals for correspondingly controlling different blocks of the second display panel 200 from the second end 1220 via the second drive circuit (not shown), and the third display panel 330 may receive different display signals for correspondingly controlling different blocks of the third display panel 330 from the third end 1230 via the third drive circuit (not shown).

In this way, the first display panel 100, the second display panel 200, and the third display panel 330 may display according to the aspects of the foregoing embodiments with relative movement of the first display panel 100, the second display panel 200, and the third display panel 330 based on the first display signal S1, the second display signal S2, the third display signal S3, and/or other display signals (for example, an extending display signal). Thereafter, the display device 44 having a relatively large size and integrated and extended display content 600 can be achieved, and image display of the same display content 600 does not change along with relative movement of the three display panels.

For example, the first display panel 100, the second display panel 200, and the third display panel 330 or the first display panel 100 and the second display panel 200 may be disposed in an environment (for example, an office room) based on a form of a curtain or a shutter, or may further be combined with a curtain or a shutter to be used in an environment, or may be applied to other suitable applications (for example, a sunshade curtain display device, an assembled curtain type display device, a situational display device, or other appropriate devices), and the present disclosure is not limited herein. Herein, in the foregoing embodiment, when applied to the foregoing usage environment, preferably, the display device may not include a backlight module, and the display device may use ambient light. The backlight module includes a light emitting source which is not the ambient light, a light guide plate or diffuser plate, or a back frame.

The foregoing two or three display panels shown are merely exemplary, and according to the present disclosure, the assembled display device substantially may use different amounts of movable display panels, and the implementation and structure thereof can be correspondingly adjusted and applied based on the principles of the foregoing embodiments.

To sum, according to FIG. 1 to FIG. 18 of the embodiments of the present disclosure, at least two display panels can be integrated and coordinated to collectively and continuously display an extended image (or namely a continued image, or an image). Therefore, an assembled display device having a relatively high display quality and large size can be achieved, and the applicability of a micro light-emitting element (for example, a micro LED) is expanded.

The foregoing descriptions are only some preferred embodiments of the present disclosure. It should be noted that various variants and modifications can be made to the present disclosure without departing from the spirit and principle of the present disclosure. One of ordinary skill in the art of the present disclosure should understand that the present disclosure is defined by the appended claims and various possible changes such as replacements, combinations, modifications, and transformations made without departing from the intention of the present disclosure should fall within the scope of the present disclosure defined by the appended claims.

LIST OF REFERENCE NUMERALS 10, 12, 14, 16, 18, 20, 22, 24, 26, 28, 30, 32, 34, 36, 38, 40, 42, and 44: Display device
15 and 15': Backlight
25 and 25': Display light
100: First display panel
101: Micro light-emitting element
102: First light-emitting area
104 and 104': First transparent area
105: First sub-pixel region
105': Virtual first sub-pixel region
110: First area
130: First overlap area
131: First portion
132: Second portion
150: First display area
200: Second display panel
201: Micro light-emitting element
202: Second light-emitting area
204 and 204': Second transparent area
205: Second sub-pixel region
205': Virtual second sub-pixel region
210: Second area
230: Second overlap area
231: Third portion
232: Fourth portion
250: Second display area
300: Detection device
301: Micro light-emitting element
305: Relative position detection signal
310: Signal source
330: Third display panel
350: Shield member
400: Control module
500: Image signal source
505: Image display signal
600: Display content
700: Light shielding layer
710: First polarizing layer
720: Second polarizing layer
800: Substrate
900: Element layer 1000: Display panel
1200: Connecting frame
1210: First end
1220: Second end
1230: Third end
D1, D2, and D3: Direction
S1: First display signal
S2: Second display signal
S3: Third display signal

What is claimed is:

1. A display device, comprising:
a first display panel having a first display area, and the first display area having a plurality of first sub-pixel regions;
a second display panel having a second display area, and the second display area having a plurality of second sub-pixel regions, wherein the second display panel is movable to at least partially overlap the first display panel;
at least one detection device disposed on at least one of the first display panel and the second display panel to detect a position of the other one and generate a relative position detection signal correspondingly; and
a control module electrically connected to the detection device, the control module receiving the relative position detection signal and an image display signal from an image signal source, so as to generate a first display signal and a second display signal to respectively output to the first display panel and the second display panel,
wherein the first display panel further comprises a first polarizing layer, and the second display panel further comprises a second polarizing layer, wherein a polarization direction of the first polarizing layer is substantially orthogonal to that of the second polarizing layer,
wherein the first display area comprises:
a first area; and
a first overlap area connected to the first area; and
the second display area comprises:
a second overlap area overlapping the first overlap area, wherein the first polarizing layer merely located in the first overlap area; and
the second polarizing layer merely located in the second overlap area.

2. The display device according to claim 1,
wherein the first display signal and the second display signal respectively control the first area and the second overlap area to collectively and continuously display an extended image.

3. The display device according to claim 2, wherein the first display signal controls a gray level value of the first overlap area to be not greater than 64.

4. The display device according to claim 2, wherein at least some of the second sub-pixel regions in the second overlap area allow light to pass through, and the first display signal controls the first overlap area to display an image substantially the same as that of the second overlap area, wherein the image of the first overlap area is displayed through the second sub-pixel regions of the second overlap area.

5. The display device according to claim 2, wherein the second display area further comprises a second area connected to the second overlap area, and the control module further generates an extending display signal based on the relative position detection signal and the image display signal, wherein the first display signal, the second display signal, and the extending display signal respectively control the first area, the second overlap area, and the second area to collectively and continuously display the extended image.

6. The display device according to claim 1, wherein
the first overlap area has a first portion connected to the first area and a second portion connected to the first portion; and
the second overlap area overlaps the first overlap area and partially allowing light to pass through, wherein the second overlap area has a third portion and a fourth portion respectively corresponding to the first portion and the second portion,
wherein the first display signal and the second display signal respectively control the first area, the first portion, and the fourth portion to collectively and continuously display an extended image.

7. The display device according to claim 1,
wherein the at least one detection device is disposed in the first overlap area and detects brightness of an image generated in the second overlap area.

8. The display device according to claim 7, wherein the at least one detection device is disposed in at least some of the first sub-pixel regions and detects brightness of the corresponding second sub-pixel regions facing the first sub-pixel regions, so as to generate the relative position detection signal.

9. The display device according to claim 1,
wherein the at least one detection device is disposed in either one of the first overlap area or the second overlap area, at least one signal source is disposed in the other one of the second overlap area or the first overlap area, and the at least one detection device detects a signal generated from the signal source to generate the relative position detection signal.

10. The display device according to claim 9, wherein the at least one detection device is disposed in either one of at least some of the first sub-pixel regions or at least some of the second sub-pixel regions, and the at least one signal source is disposed in the other one of the at least some of the second sub-pixel regions or the at least some of the first sub-pixel regions.

11. The display device according to claim 1, further comprising at least one signal source disposed corresponding to the at least one detection device, wherein the at least one detection device is disposed outside of either one of the first display area or the second display area, and the at least one signal source is disposed outside of the other one of the first display area or the second display area.

12. The display device according to claim 1,
wherein each of the first sub-pixel regions in the first overlap area has at least one first light-emitting area; and
wherein each of the second sub-pixel regions in the second overlap area has at least one second light-emitting area, and projection ranges of the first light-emitting areas in the second overlap area are staggered with the second light-emitting areas.

13. The display device according to claim 12, further comprising at least one first transparent area in the first overlap area and at least one second transparent area in the second overlap area,
wherein the at least one first light-emitting area corresponds to the at least one first transparent area, and the at least one second light-emitting area corresponds to the at least one second transparent area, and
wherein the at least one second transparent area at least partially overlaps the at least one first light-emitting area.

14. The display device according to claim 13, wherein the at least one first light-emitting area and the at least one first transparent area are located in the same first sub-pixel region, and the at least one second light-emitting area and the at least one second transparent area are located in the same second sub-pixel region.

15. The display device according to claim 13, wherein the at least one first transparent area serves as a virtual first sub-pixel region, the at least one second transparent area serves as a virtual second sub-pixel region, the virtual first sub-pixel region corresponds to the first sub-pixel region, and the virtual second sub-pixel region corresponds to the second sub-pixel region.

16. The display device according to claim 12, wherein each of the first light-emitting areas and each of the second light-emitting area respectively comprises at least one micro light-emitting element.

17. The display device according to claim 16, wherein the thickness of the first overlap area and the second overlap area are less than the thickness of the first area and a second area connected to the second overlap area.

18. The display device according to claim 1,
wherein the thickness of the first overlap area is less than the thickness of the first area.

19. The display device according to claim 18, wherein the second display area further comprises a second area connected to the second overlap area, and the thickness of the second overlap area is less than the thickness of the second area.

20. The display device according to claim 1,
wherein the second overlap area comprises at least one transparent area,
wherein the first display panel further comprises a light shielding layer, the light shielding layer is located in the first area and the first overlap area, and the at least one transparent area in the second overlap area at least partially overlaps the light shielding layer in the first overlap area.

21. The display device according to claim 1, further comprising a connecting frame, the first display panel having a first end movably connected to the connecting frame, and the second display panel having a second end movably connected to the connecting frame, wherein the first display panel receives the first display signal from the first end via a first drive circuit and the second display panel receives the second display signal from the second end via a second drive circuit.

* * * * *